United States Patent [19]

Jang

[11] Patent Number: 5,644,474

[45] Date of Patent: Jul. 1, 1997

[54] VIDEO CASSETTE RECORDER INCORPORATING THEREIN A GROUNDING SYSTEM

[75] Inventor: Gi-Il Jang, Seoul, Rep. of Korea

[73] Assignee: Daewoo Electronics Co., Ltd., Seoul, Rep. of Korea

[21] Appl. No.: 617,590

[22] Filed: Mar. 19, 1996

[30] Foreign Application Priority Data

Apr. 28, 1995 [KR] Rep. of Korea .................. 95-8944

[51] Int. Cl.$^6$ .................................................. H05K 5/00
[52] U.S. Cl. ............................................................. 361/753
[58] Field of Search .................................. 361/763, 799, 361/816, 818, 724, 748, 220, 212; 307/95; 439/607

[56] References Cited

U.S. PATENT DOCUMENTS 5,546,280   8/1996   Hasebe et al. .................. 361/753

Primary Examiner—Leo P. Picard
Assistant Examiner—David Foster
Attorney, Agent, or Firm—Pennie & Edmonds

[57] ABSTRACT

A main chassis includes a boss, a supporting protrusion having a guide pin and a recess portion having a deformation preventing jaw. A ground plate includes a first horizontal portion with a hole, a second horizontal portion with an inserting hole, a vertical portion connecting between the first and the second horizontal portions and passing through a first through-hole of a printed circuit board, a bending portion inserted into the recess portion of the main chassis to ground with a lower cover, a tip end horizontally extended from the bending portion to allow the bending portion to resiliently contact with the deformation preventing jaw, and a slant portion connecting between the second horizontal portion and the bending portion. The inserting hole of the second horizontal portion and the second through-hole of the printed circuit board are inserted into the guide pin of the supporting protrusion, thereby allowing the second horizontal portion of the ground plate to be sandwiched between the printed circuit board and the supporting protrusion.

2 Claims, 2 Drawing Sheets

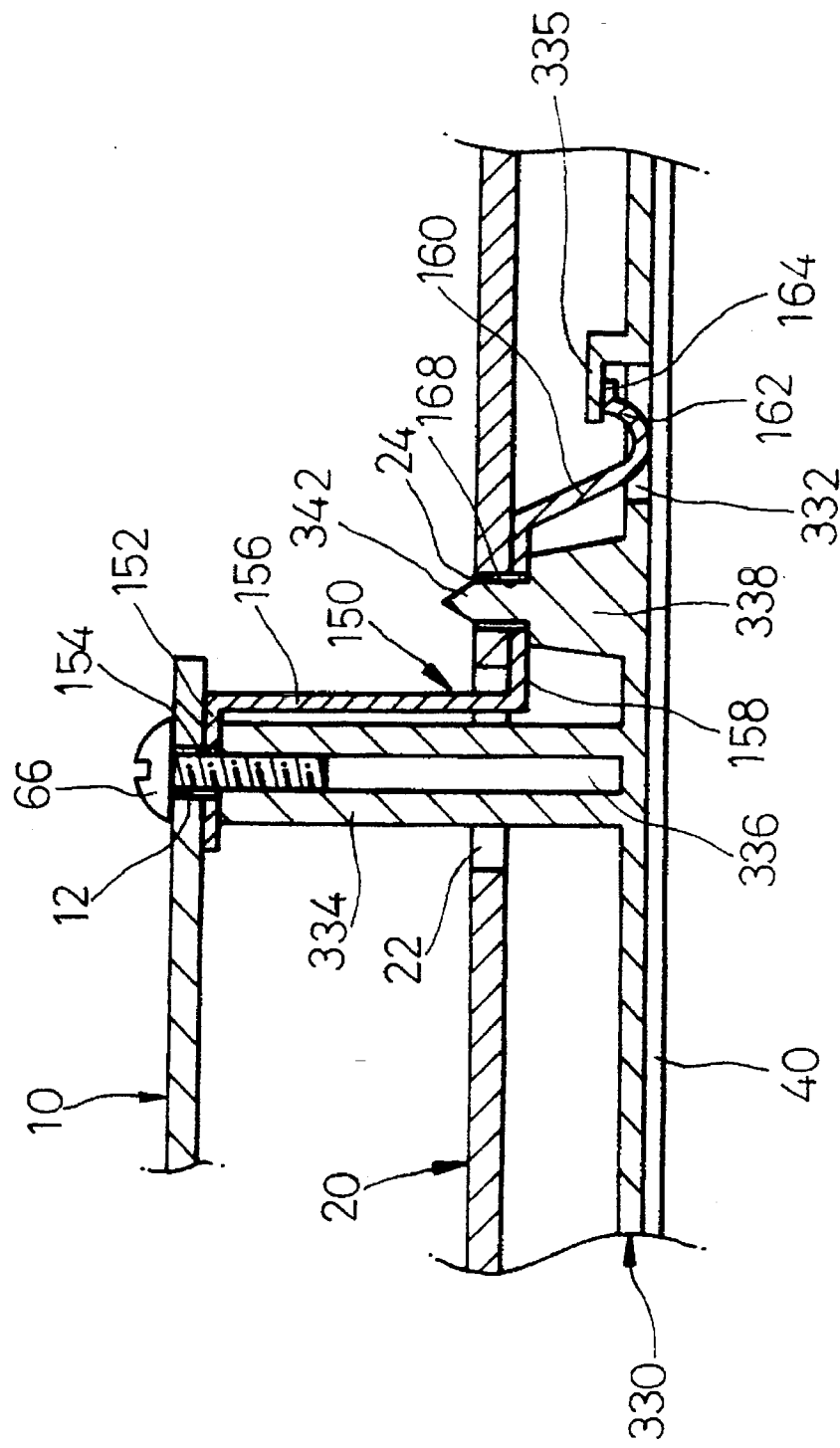

VIDEO CASSETTE RECORDER INCORPORATING THEREIN A GROUNDING SYSTEM

FIELD OF THE INVENTION

The present invention relates to a video cassette recorder ("VCR"); and, more particularly, to a video cassette recorder incorporating therein an improved grounding system that can be easily assembled and practiced.

DESCRIPTION OF THE PRIOR ART

As is well known, a VCR is manufactured by mounting a printed circuit board on a main chassis, and then mounting on top of the printed circuit board a deck assembly including a head drum and a housing for loading and unloading a tape cassette. An upper and a lower covers are provided on top and bottom of the main chassis, respectively. Further, the VCR includes a grounding system for removing static electricity from the deck assembly and the printed circuit board. In general, such a grounding system is provided with a ground plate in contact with the lower cover and the deck assembly to form a electrical signal loop, thereby preventing the development of static electricity.

A typical grounding system for use in a VCR is schematically shown in FIG. 1. The prior art grounding system includes a deck assembly 10 having a hole 12 formed at a side thereof; a main chassis 30 having a boss 34 upwardly projected to be engaged with the hole 12 of the deck assembly 10 and a recess portion 32 formed adjacent to the boss 34; a printed circuit board 20 having a first through-hole 22 inserted into the boss 34 of the main chassis 30 and a second through-hole 24 formed adjacent to the first through-hole 22; and a ground plate 50 having a first horizontal portion 52 with a hole 54, a second horizontal portion 58 welded to the printed circuit board 20, a first slant portion 56 connecting between the first horizontal portion 52 and the second horizontal portion 58, a third horizontal portion 62 inserted into the recess portion 32 of the main chassis 30 to ground with a lower cover 40 disposed to the bottom of the main chassis 30, and a second slant portion 60 connecting between the second horizontal portion 58 and the third horizontal portion 62 to be inserted into the second through-hole 24 of the print circuit board 20. A screw 66 is inserted through the hole 12 of the deck assembly 10 and the hole 54 of the first horizontal portion 52 of the ground plate 50 into a hollow portion 36 of the boss 34 of the main chassis 30, thereby allowing the ground plate 50 to be sandwiched between the deck assembly 10 and the boss 34 of the main chassis 30.

In the conventional grounding system, the second horizontal portion 58 of the ground plate 50 and the printed circuit board 20 must be soldered together, introducing an additional step in assembling the ground plate 50, lowering the production efficiency thereof. Further, the welding may become inadvertently disjoined during the assembling of the VCR, allowing the third horizontal portion of the ground plate to be disconnected from the lower cover, thereby hampering the grounding system from performing its intended function.

SUMMARY OF THE INVENTION

It is, therefore, a primary object of the invention to provide an improved grounding system that can be easily assembled and reliably operated.

The above and other objects of the present invention are accomplished by incorporating in a VCR an improved grounding system for forming a electrical signal loop from a deck assembly to a lower cover of the VCR, the grounding system comprising:

a main chassis having a boss upwardly projected to be engaged with a hole formed at a side of the deck assembly, a supporting protrusion formed adjacent to the boss and a recess portion formed adjacent to the supporting protrusion, the supporting protrusion having a guide pin projected therefrom and the recess portion being provided with a deformation preventing jaw;

a printed circuit board having a first through-hole inserted into the boss of the main chassis and a second through-hole formed adjacent to the first through-hole; and a ground plate having a first horizontal portion with a hole, a second horizontal portion with an inserting hole, a vertical portion connecting between the first horizontal portion and the second horizontal portion and passing through the first through-hole of the printed circuit board, a bending portion inserted into the recess portion of the main chassis to ground with the lower cover, a tip end horizontally extended from the bending portion to allow the bending portion to resiliently contact with the deformation preventing jaw, and a slant portion connecting between the second horizontal portion and the bending portion, the inserting hole of the second horizontal portion and the second through-hole of the printed circuit board being inserted into the guide pin of the supporting protrusion, thereby allowing the second horizontal portion of the ground plate to be sandwiched between the printed circuit board and the supporting protrusion.

BRIEF DESCRIPTION OF THE DRAWINGS

The above and other objects, features and advantages of the present invention will become apparent from the following detailed description, when taken in conjunction with the accompanying drawings, in which:

FIG. 2 represents a partial sectional view of the grounding system in accordance with the present invention.

DETAILED DESCRIPTION OF THE PREFERRED EMBODIMENTS

Figure 1:
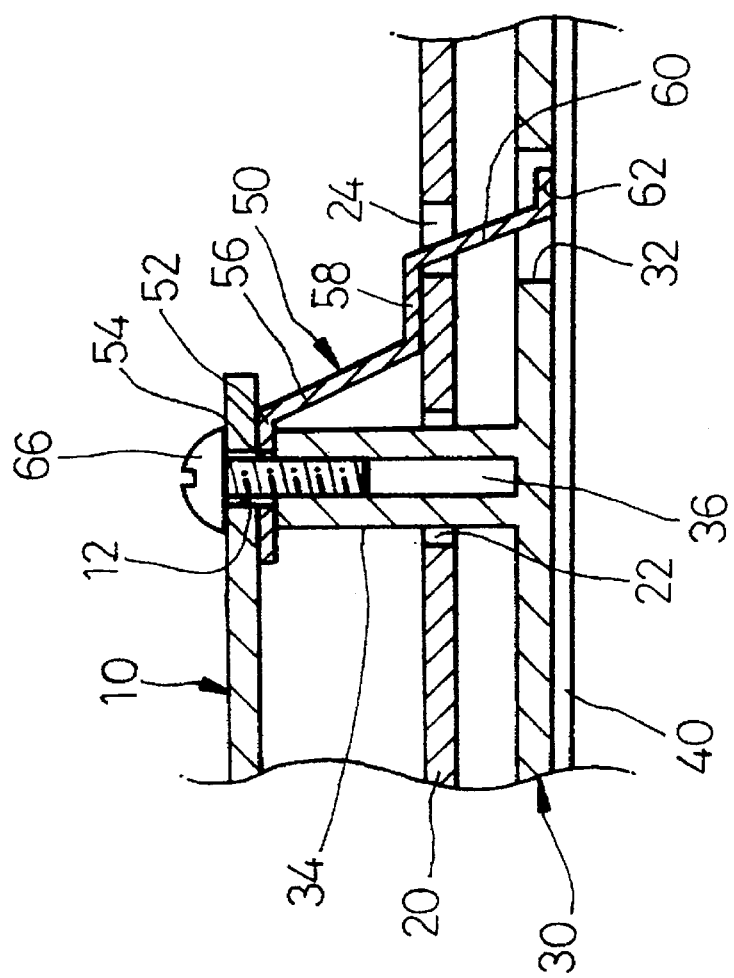
FIG. 1 shows a partial sectional view of the conventional grounding system.

Referring now to FIG. 2, there is shown an inventive grounding system in accordance with a preferred embodiment of the invention. The grounding system shown therein forms a electrical signal loop from a deck assembly 10 to a lower cover 40 of the VCR and includes a main chassis 330, a printed circuit board 20 and a ground plate 150. The deck assembly 10 and the printed circuit board 20 as shown in FIG. 2 are of the same construction as that depicted in FIG. 1. The deck assembly 10 has a hole 12 formed at a side thereof and the printed circuit board 20 includes the first through-hole 22 and the second through-hole 24. The main chassis 330 comprises a boss 334 upwardly projected to be engaged with the hole 12 of the deck assembly 10, a supporting protrusion 338 formed adjacent to the boss 334 and a recess portion 332 formed adjacent to the supporting protrusion 338. Further, the supporting protrusion 338 of the main chassis 330 has a guide pin 342 projected therefrom and the recess portion 332 of the main chassis 330 is provided with a deformation preventing jaw 335. The ground plate 150 comprises a first horizontal portion 152 with a hole 154, a second horizontal portion 158 with an inserting hole 168, a vertical portion 156 connecting between the first horizontal portion 152 and the second horizontal portion 158 and passing through the first through-hole 22 of the printed circuit board 20, a bending portion 162 inserted into the recess portion 332 of the main chassis 330 to ground with the lower cover 40, a tip end 164 horizontally extended from the bending portion 162 to allow the bending portion 162 to resiliently contact with the deformation preventing jaw 335, and a slant portion 160 connecting between the second horizontal portion 168 and the bending portion 162.

On the other hand, the deck assembly 10 and the first horizontal portion 152 of the ground plate 150 are engaged with a hollow portion 336 of the boss 334 of the main chassis 330 by means of a screw 66 so that the first horizontal portion 152 of the ground plate 150 functions as a grounding surface. Further, the inserting hole 168 of the second horizontal portion 158 and the second through-hole 24 of the printed circuit board 20 are inserted into the guide pin 342 of the supporting protrusion 338 in the main chassis 330, thereby allowing the second horizontal portion 158 of the ground plate 150 to be sandwiched between the printed circuit board 20 and the supporting protrusion 338. As a result, the second horizontal portion 158 of the ground plate 150 functions as a grounding surface. At this time, the top surface of the second horizontal portion 158 may be preferably applied with a thin copper coating. Furthermore, the tip end 164 of the ground plate 150 is in contact with the deformation preventing jaw 335 so that the bending portion 162 is resiliently contacted with the deformation preventing jaw 335. As a result, the bending portion 162 functions as a grounding surface.

Although the invention has been shown and described with respect to the preferred embodiments, it will be understood by those skilled in the art that certain changes and modifications may be made without departing from the spirit and scope of the invention as defined in the following claims.

What is claimed is:

1. A video cassette recorder incorporating therein a grounding system for forming an electrical signal loop from a deck assembly to a lower cover of the video cassette recorder, the grounding system comprising:

a main chassis having a boss upwardly projected to be engaged with a hole formed at a side of the deck assembly, a supporting protrusion formed adjacent to the boss and a recess portion formed adjacent to the supporting protrusion, the supporting protrusion having a guide pin projected therefrom and the recess portion being provided with a deformation preventing jaw;

a printed circuit board having a first through-hole inserted into the boss of the main chassis and a second through-hole formed adjacent to the first through-hole; and a ground plate having a first horizontal portion with a hole, a second horizontal portion with an inserting hole, a vertical portion connecting between the first horizontal portion and the second horizontal portion and passing through the first through-hole of the printed circuit board, a bending portion inserted into the recess portion of the main chassis to ground with the lower cover, a tip end horizontally extended from the bending portion to allow the bending portion to resiliently contact with the deformation preventing jaw, and a slant portion connecting between the second horizontal portion and the bending portion, the inserting hole of the second horizontal portion and the second through-hole of the printed circuit board being inserted into the guide pin of the supporting protrusion, thereby allowing the second horizontal portion of the ground plate to be sandwiched between the printed circuit board and the supporting protrusion.

2. The video cassette recorder of claim 1, wherein the top surface of the second horizontal portion is applied with a thin copper coating.

* * * * *